United States Patent
Kaneko et al.

(10) Patent No.: US 8,404,575 B2
(45) Date of Patent: *Mar. 26, 2013

(54) SEMICONDUCTOR DEVICE AND METHOD FOR MANUFACTURING SAME

(75) Inventors: Akio Kaneko, Fishkill, NY (US); Seiji Inumiya, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/311,850

(22) Filed: Dec. 6, 2011

(65) Prior Publication Data

US 2012/0077336 A1   Mar. 29, 2012

Related U.S. Application Data

(62) Division of application No. 12/512,221, filed on Jul. 30, 2009, now Pat. No. 8,084,834.

(30) Foreign Application Priority Data

Jul. 31, 2008  (JP) ................................. 2008-197370

(51) Int. Cl.
*H01L 21/3205* (2006.01)
(52) U.S. Cl. .... 438/591; 438/592; 257/411; 257/21.625
(58) Field of Classification Search .................. 438/591, 438/592; 257/411, E21.625
See application file for complete search history.

(56) References Cited

U.S. PATENT DOCUMENTS

| | | | |
|---|---|---|---|
| 6,271,573 B1* | 8/2001 | Suguro | 257/407 |
| 8,084,834 B2* | 12/2011 | Kaneko et al. | 257/411 |
| 2004/0046217 A1 | 3/2004 | Iwasaki et al. | |
| 2005/0116266 A1* | 6/2005 | Hirano | 257/288 |
| 2005/0205947 A1 | 9/2005 | Yu et al. | |
| 2006/0113603 A1* | 6/2006 | Currie | 257/368 |
| 2007/0212896 A1* | 9/2007 | Olsen et al. | 438/758 |
| 2007/0215950 A1 | 9/2007 | Aoyama | |
| 2008/0164581 A1 | 7/2008 | Cho et al. | |
| 2009/0209095 A1 | 8/2009 | Horii | |

FOREIGN PATENT DOCUMENTS

| | | |
|---|---|---|
| JP | 2007-258267 | 10/2007 |
| JP | 2008-172227 | 7/2008 |
| WO | WO 2006/137287 A1 | 12/2006 |

OTHER PUBLICATIONS

Hwang et al., "A Novel Hafnium Carbide ($HfC_x$) Metal Gate Electrode for NMOS Device Application", Symposium on VLSI Technology Digest of Technical Papers, pp. 156-157, (2007).
Hirano et al., "High Performance nMOSFET With $HfSi_x/HfO_2$ Gate Stack by Low Temperature Process", IEDM, pp. 911-914, (2005).
Notification of Reason(s) for Refusal issued by the Japanese Patent Office on Dec. 3, 2012, for Japanese Patent Application No. 2008-197370, and English-language translation thereof.

\* cited by examiner

*Primary Examiner* — Steven J Fulk
(74) *Attorney, Agent, or Firm* — Finnegan, Henderson, Farabow, Garrett & Dunner, L.L.P.

(57) ABSTRACT

A semiconductor device of the present invention includes: a semiconductor layer; a gate insulation film provided on the semiconductor layer and including at least one of Hf and Zr; and a gate electrode provided on the gate insulation film and including a carbonitride which includes at least one of Hf and Zr.

10 Claims, 3 Drawing Sheets

SEMICONDUCTOR DEVICE AND METHOD FOR MANUFACTURING SAME

CROSS-REFERENCE TO RELATED APPLICATIONS

This is a divisional of Application No. 12/512,221, filed Jul. 30, 2009 now U.S. Pat. No. 8,084,834, which is incorporated herein by reference.

This application is based upon and claims the benefits of priority from the prior Japanese Patent Application No. 2008-197370, filed on Jul. 31, 2008; the entire contents of which are incorporated herein by reference.

BACKGROUND OF THE INVENTION

1. Field of the Invention

The present invention relates to a semiconductor device and a method for manufacturing the same.

2. Background Art

HfSiON is considered to be promising in regard to leak current, dielectric constant, thermal stability, etc., as a gate insulation film material to replace $SiO_2$. Also, metal gate electrodes are favorable to improve transistor performance.

However, in the case where, for example, TiN is used as a gate electrode in a structure in which HfSiON is used as a gate insulation film, Hf in the HfSiON film undesirably diffuses into the TiN film due to heating during manufacturing steps, causing an undesirable increase of leak current and deterioration of reliability of the gate insulation film.

Although gate electrodes of HfSi and HfC formed as films by sputtering are reported by T. Hirano et al., IEDM 2005, 911 and by W. S. Hwang et al., VLSI 2007, 156, respectively, concerns remain in regard to film-quality defects due to sputter damage.

SUMMARY OF THE INVENTION

According to an aspect of the invention, there is provided a semiconductor device, including: a semiconductor layer; a gate insulation film provided on the semiconductor layer and including at least one of Hf and Zr; and a gate electrode provided on the gate insulation film and including a carbonitride which includes at least one of Hf and Zr.

According to another aspect of the invention, there is provided a method for manufacturing a semiconductor device, including: forming a gate insulation film including at least one of Hf and Zr on a semiconductor layer; and forming a gate electrode including a carbonitride which includes at least one of Hf and Zr on the gate insulation film.

DETAILED DESCRIPTION OF THE INVENTION

An embodiment of the present invention will now be described with reference to the drawings.

Figure 1:
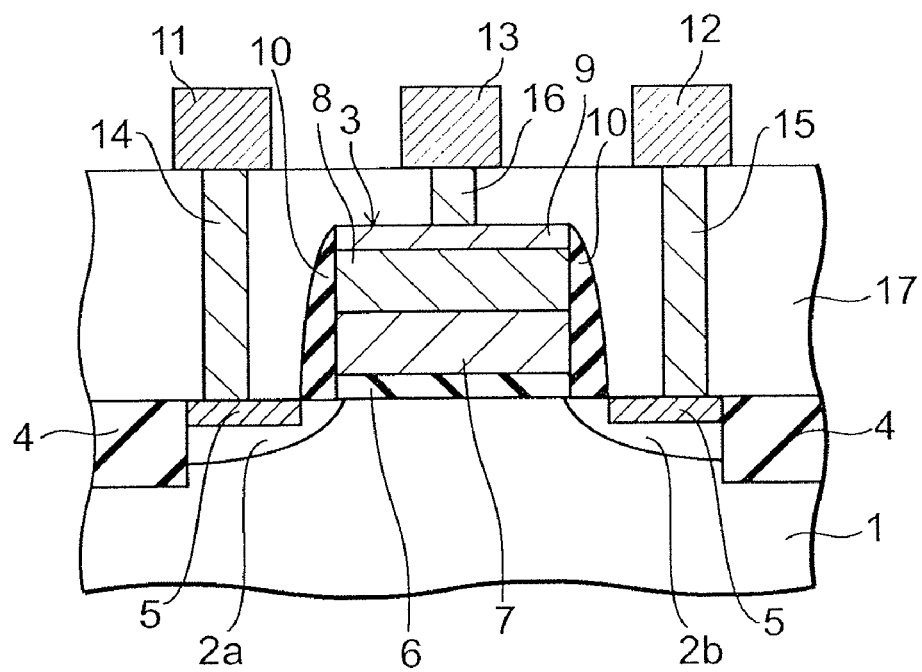
FIG. 1 is a schematic cross-sectional view of main components of a semiconductor device according to an embodiment of the present invention.

FIG. 1 is a cross-sectional view of main components of a semiconductor device according to an embodiment of the present invention. In the embodiment of the present invention, the semiconductor device is illustrated having a MISFET (Metal-Insulator-Semiconductor Field Effect Transistor) structure in which a gate electrode is provided on a channel formation region of a semiconductor layer via a gate insulation film. The present invention is applicable to both an n-type MISFET and a p-type MISFET.

Multiple transistor devices are formed on a silicon substrate 1. Each device is separated from the other devices by, for example, a device separation layer 4 having an STI (Shallow Trench Isolation) structure.

A source region 2a and a drain region 2b are selectively formed in a top layer portion of the silicon substrate 1.

A gate insulation film 6 is provided on the surface of the silicon substrate 1 between the source region 2a and the drain region 2b. A gate electrode 3 is provided on the gate insulation film 6.

The gate electrode 3 includes a first gate electrode 7 and a second gate electrode 8 laminated in order from the gate insulation film 6 side. A silicide film 9 is formed on a top layer portion of the second gate electrode 8 by siliciding the top layer portion.

A side wall insulative film 10 is provided on a side wall of the gate insulation film 6 and the gate electrode 3. An inter-layer insulative layer 17 is provided on the silicon substrate 1 to cover the gate electrode 3 and the side wall insulative film 10.

A source lead 11, a drain lead 12, and a gate lead 13 are provided on the inter-layer insulative layer 17. A silicide film 5 is formed on top layer portions of each of the source region 2a and the drain region 2b by siliciding the top layer portions.

The source region 2a connects to the source lead 11 via the silicide film 5 formed in the top layer portion thereof and a contact 14 provided to pass through the inter-layer insulative layer 17. The drain region 2b is connected to the drain lead 12 via the silicide film 5 formed on the top layer portion thereof and a contact 15 provided to pass through the inter-layer insulative layer 17. The gate electrode 3 connects to the gate lead 13 via the silicide film 9 formed on the top layer portion thereof and a contact 16 provided to pass through the inter-layer insulative layer 17.

Figure 2:
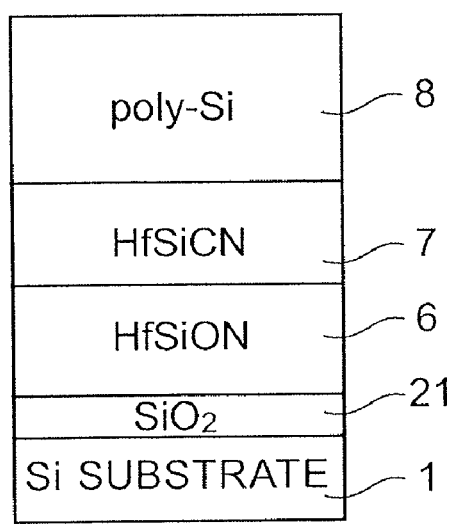
FIG. 2 is a schematic cross-sectional view illustrating a first specific example of a gate structure of the semiconductor device illustrated in FIG. 1.

FIG. 2 is a schematic cross-sectional view illustrating a first specific example of a gate structure of the semiconductor device illustrated in FIG. 1.

An $SiO_2$ film 21 (which also functions as the gate insulation film) is formed on the channel formation region of the silicon substrate 1. The gate insulation film 6 is formed on the $SiO_2$ film 21; the first gate electrode 7 is formed on the gate insulation film 6; and the second gate electrode 8 is formed on the first gate electrode 7.

The gate insulation film 6 is a high-k (high dielectric constant) film including at least one of Hf (hafnium) and Zr (zirconium). In this specific example, the gate insulation film 6 is, for example, an HfSiON film.

The first gate electrode 7 includes a carbonitride including at least one of Hf and Zr. In this specific example, the first gate electrode 7 is, for example, an HfSiCN film. The second gate electrode 8 is, for example, a polycrystalline silicon film.

The materials of the other components in FIG. 1 may use $SiO_2$ for the device separation layer 4, NiPtSi for the silicide films 5 and 9, SiN for the side wall insulative film 10, $SiO_2$ for the inter-layer insulative layer 17, W (tungsten) for the contacts 14 to 16, and Cu for the leads 11 to 13. Here, each material is one example, and other appropriate materials may be used.

In the structure according to this embodiment, the gate insulation film 6 (for example, the HfSiON film) which includes at least one of Hf and Zr is used with the gate electrode 7 (for example, the HfSiCN film) which also includes at least one of Hf and Zr. Compositional variation due to mutual diffusion of Hf between the gate insulation film 6 and the gate electrode 7 can thereby be reduced. In particular, compositional variation of the gate insulation film 6 can be reduced to provide a high-quality high-k gate insulation film 6 having stable film quality.

C (carbon) and N (nitrogen) are added to the gate electrode 7; and the gate electrode 7 has a structure which includes a carbonitride including at least one of Hf and Zr. Thereby, the thermal stability can be improved.

One example of a method for manufacturing the gate structure of this specific example will now be described.

First, HF (hydrofluoric acid) processing is performed on the surface of the silicon substrate 1. Then, the $SiO_2$ film 21 is formed on the surface of the silicon substrate 1 with a thickness of 0.4 to 1.3 nm using a solution containing HCl, $H_2O_2$, $O_3$, and the like according to the desired characteristics. Alternatively, the $SiO_2$ film 21 may be formed on the surface with a thickness of 0.6 to 1.5 nm by annealing the silicon substrate 1 in an atmosphere of $O_2$, $H_2$, $N_2$, HCl, and the like.

Continuing, an HfSiO film having an Hf/(Hf+Si) ratio of 50% and a thickness of 3 nm is formed on the $SiO_2$ film 21 by thermal CVD (chemical vapor deposition) (also referred to hereinbelow as simply "CVD") using TDEAH (tetrakis(diethylamino)hafnium: $Hf[N(C_2H_5)_2]_4$) as the precursor of Hf, using TDMAS (tetrakis(dimethylamino)silane: $Si[N(CH_3)_2]_4$) as the precursor of Si, and using $O_2$ gas and $N_2$ gas.

At this time, the silicon substrate 1 is heated to 600° C.; TDEAH is introduced into the chamber at 5 mg/minute, TDMAS is introduced at 35 mg/minute, $O_2$ gas is introduced at 10 slm, and $N_2$ gas is introduced at 5 slm. The chamber pressure is 3.0 Torr.

In regard to productivity, it is favorable that the flow rate of each of TDEAH and TDMAS is not less than 1 mg/minute. In regard to vaporization, it is favorable that the flow rate of TDEAH is not more than 20 mg/minute and the flow rate of TDMAS is not more than 100 mg/minute. Higher flow rates may cause clogging of pipes.

Increasing $O_2$ gas provides good film quality of the HfSiO film, and namely reduces the gate-leakage current. Typically, the flow rate of $O_2$ gas is 5 to 20 slm.

Uniformity of the film thickness of the surface improves as the chamber pressure is reduced, and it is favorable that the chamber pressure is 0.3 to 30 Torr. Although the film quality of the HfSiO film can be improved by increasing the substrate temperature, too high of a substrate temperature results in unnecessary products in the chamber. Therefore, it is favorable that the substrate temperature is 500 to 700° C.

The film thickness of the HfSiO film can be adjusted by changing the deposition time. Typically, the film thickness is 1.5 to 2.5 nm. The Hf/(Hf+Si) ratio may be varied in the range of 10 to 100% by changing the flow rate ratio of TDEAH and TDMAS, the chamber pressure, and the $O_2$ gas flow rate.

$Hf(NR^1R^2)_4$ may be used as the precursor of Hf, where $R^1$ and $R^2$ are selected from H, $CH_3$, $C_2H_5$, and $C_3H_7$. To prevent misconstruing "$R^1$" and "$R^2$" as one and two groups of "R," the connotation of "$R^1$" and "$R^2$" is intentionally used instead of "$R_1$." and "$R_2$." The same holds true for $R^3$, $R^4$, $R^5$, and $R^6$ hereinbelow.

$SiR^3R^4R^5R^6$ may be used as the precursor of Si, where $R^3$, $R^4$, $R^5$, and $R^6$ are selected from H, $NH_2$, $N(CH_3)_2$, $N(C_2H_5)_2$, and $N(C_3H_7)_2$. However, in the case where $SiH_4$ is selected, the range of possible ratios of Hf and Si is small in comparison to that of the others.

Then, an HfSiON film is formed as the gate insulation film 6 by adding nitrogen to the HfSiO film (by plasma nitriding) by creating plasma in the chamber at 13.56 MHz and 1,000 W using a chamber pressure of 20 mTorr and an atmosphere containing $N_2$ gas or $NH_3$ gas.

Continuing, annealing with $O_2$ gas having a partial pressure of 5 mTorr is performed for ten seconds at 1,000° C. The damage due to plasma processing is thereby repaired. The atmosphere in the chamber may contain $N_2$ gas, $H_2$ gas, $N_2O$ gas, and the like.

Then, an HfSiCN film (the gate electrode 7) having an Hf/(Hf+Si) ratio of 50% and a thickness of 2 nm is formed on the HfSiON film (the gate insulation film 6) by CVD using TDEAH ($Hf[N(C_2H_5)_2]_4$) as the precursor of Hf, using TDMAS ($Si[N(CH_3)_2]_4$) as the precursor of Si, and using $N_2$ gas.

At this time, the silicon substrate 1 is heated to 600° C.; TDEAH is introduced into the chamber at 5 mg/minute, TDMAS is introduced at 35 mg/minute, and $N_2$ gas is introduced at 15 slm. The chamber pressure is 3 Torr.

In regard to productivity, it is favorable that the flow rate of each of TDEAH and TDMAS is not less than 1.0 mg/minute. In regard to vaporization, it is favorable that the flow rate of TDEAH is not more than 20 mg/minute and the flow rate of TDMAS is not more than 100 mg/minute. Higher flow rates may cause clogging of pipes.

Increasing the $N_2$ gas provides good uniformity of the film thickness of the surface. Typically, the flow rate of $N_2$ gas is 10 to 20 slm.

The concentration of nitrogen may be increased by adding $NH_3$ gas or $ND_3$ gas (D being deuterium) to the atmosphere. By adding $H_2$ gas to the atmosphere, effects of residual oxygen in the chamber can be reduced, and the film quality of the HfSiCN film can be improved.

Uniformity of the film thickness of the surface improves as the chamber pressure decreases, and it is favorable that the chamber pressure is 0.3 to 30 Torr. C (carbon) and N (nitrogen) increase as the substrate temperature decreases. Typically, it is favorable that the substrate temperature is 500 to 700° C.

The film thickness can be adjusted by changing the deposition time. Typically, the film thickness is 2.0 to 10 nm. The Hf/(Hf+Si) ratio may be varied in the range of 10 to 100% by changing the flow rate ratio of TDEAH and TDMAS and pressure. It is favorable that the Hf/(Hf+Si) ratio is not less than 33% in regard to resistivity and not more than 67% in regard to thermal stability.

The Hf/(Hf+Si) ratio may be less than 33% by making the film thickness sufficiently thin.

$Hf(NR^1R^2)_4$ may be used as the precursor of Hf, where $R^1$ and $R^2$ are selected from H, $CH_3$, $C_2H_5$, and $C_3H_7$.

$SiR^3R^4R^5R^6$ may be used as the precursor of Si, where $R^3$, $R^4$, $R^5$, and $R^6$ are selected from H, $NH_2$, $N(CH_3)_2$, $N(C_2H_5)_2$, and $N(C_3H_7)_2$. However, in the case where $SiH_4$ is selected, the range of possible ratios of Hf and Si is small in comparison to that of the others.

By utilizing C and N in the precursor of Hf and/or the precursor of Si when forming the HfSiCN film as the gate electrode 7, a gate electrode 7 having a stable composition ratio can be formed; and threshold voltage variation due to local composition ratio variation can be reduced.

Costs can be reduced by using the same precursor of Hf and precursor of Si when forming the HfSiON film as the gate insulation film 6 and the HfSiCN film as the gate electrode 7.

Using CVD to form the gate insulation film 6 and the gate electrode 7 as films can inhibit mixing and damage during deposition in comparison to deposition by sputtering.

Continuing, plasma nitriding is performed at 13.56 MHz and 1,000 W using a chamber pressure of 20 mTorr and an atmosphere containing $N_2$ gas or $NH_3$ gas. At this time, C (carbon) simultaneously decreases. It is favorable that this step is performed in the same chamber used to form the HfSiCN film recited above, or a low oxygen partial pressure is provided when moving the substrate in the case where another chamber is used.

Then, annealing is performed at 1,000° C. and 5 Torr in an $N_2$ gas atmosphere for 10 seconds. Thereby, Hf bonds damaged by plasma and the state of the nitrogen introduced during the plasma nitriding is stabilized. To retain the conductivity, low amounts of $O_2$ and $H_2O$ in the atmosphere are favorable, and it is favorable that the $O_2$ gas is not more than 1 ppm or has a partial pressure of not more than 0.7 mTorr. This step reduces the concentration of C and N. It is favorable that this step is performed in the same chamber used for the plasma nitriding recited above, or a low oxygen partial pressure is provided when moving the substrate in the case where another chamber is used.

The composition ratios of Hf, Si, C, and N in the HfSiCN film can be changed by changing the conditions of each step of the HfSiCN deposition, the subsequent plasma nitriding, and the annealing recited above. The concentration of C can be adjusted in a range of 1 to 50 atomic %. The concentration of N can be adjusted in a range of 1 to 50 atomic %.

Then, the polycrystalline silicon film 8 with a thickness of 50 nm is formed on the gate electrode 7 (the HfSiCN film) at 620° C. and 1 Torr in an atmosphere of $SiH_4$, $N_2$, and $H_2$. It is favorable to perform the deposition by CVD using $SiH_4$ gas or $Si_2H_6$ gas; but deposition also may be performed by sputtering. It is favorable that this step is performed in the same chamber used for the annealing recited above, or a low oxygen partial pressure is provided when moving the substrate in the case where another chamber is used.

Continuing, lithography and RIE (Reactive Ion Etching) are used to form the polycrystalline silicon film 8 into a desired gate configuration. Using the polycrystalline silicon film 8 as a mask, the gate electrode 7 (the HfSiCN film) is formed by RIE or wet etching, after which the gate insulation film 6 (the HfSiON film) is formed by RIE or wet etching. Ion implantation is then used to provide conductivity by introducing an impurity into the polycrystalline silicon film 8.

The gate structure thus formed into the desired configuration is used as a mask to implant an impurity into the surface of the silicon substrate 1 by ion implantation to form the source region 2a and the drain region 2b. The structure illustrated in FIG. 1 is then obtained by performing silicide processing on the top layer portions of the source region 2a, the drain region 2b, and the polycrystalline silicon film 8; forming the inter-layer insulative film 17; forming the contacts 14 to 16 and the leads 11 to 13; and the like.

Figure 3:
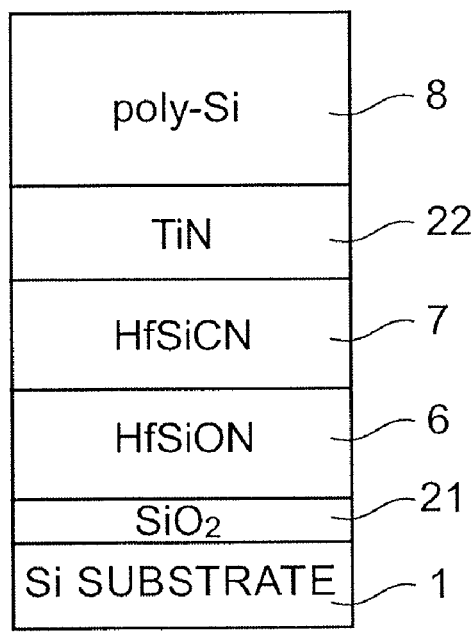
FIG. 3 is a schematic cross-sectional view illustrating a second specific example of the gate structure of the semiconductor device illustrated in FIG. 1.

FIG. 3 is a schematic cross-sectional view illustrating a second specific example of the gate structure of the semiconductor device illustrated in FIG. 1.

The steps that form the $SiO_2$ film 21, the gate insulation film 6 (for example, an HfSiON film) and the gate electrode 7 (for example, an HfSiCN film) in order on the silicon substrate 1 are similar to those of the specific example described above in regard to FIG. 2.

In this specific example, a TiN film 22 with a thickness of about 5 nm is then formed on the HfSiCN film. It is favorable that this step is performed in the same chamber used for the annealing after forming the HfSiCN film, or a low oxygen partial pressure is provided when moving the substrate in the case where another chamber is used. The TiN film 22 may be formed by CVD using $TiCl_4$ gas and $NH_3$ gas or by sputtering using a Ti or a TiN target.

After forming the TiN film 22, a gate structure is obtained similarly to that of the specific example described above using a step that forms the polycrystalline silicon film 8 on the TiN film 22 and the steps that form the $SiO_2$ film 21, the gate insulation film 6 (for example, the HfSiON film), the gate electrode 7 (for example, the HfSiCN film), the TiN film 22, and the polycrystalline silicon film 8 into the desired configuration.

Hf and Zr readily can be oxidized when exposed to ambient air. In other words, the HfSiCN film formed as the gate electrode 7 readily can be oxidized. Conversely, TiN which is oxidized less readily than the HfSiCN film can be made.

Accordingly, it is unnecessary to use the same chamber as that of the HfSiCN deposition or provide a low oxygen partial pressure when moving the substrate to form the polycrystalline silicon film 8. The HfSiCN film functions as the metal gate electrode 7; and the TiN film 22 is a protective film that prevents oxidation of the HfSiCN film. Therefore, the composition of the TiN film 22 is not particularly important. Materials such as MoN, WN, TaC, TaSiN, TaN, AlN, and the like may be used instead of TiN as the protective film.

Figure 4:
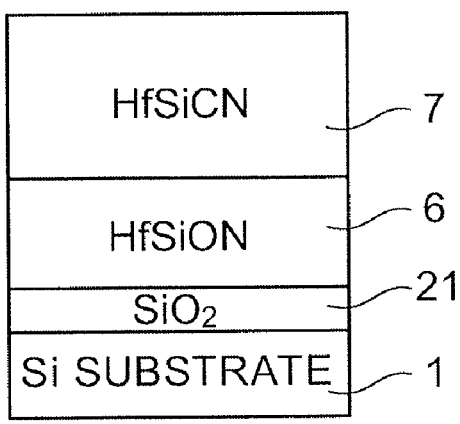
FIG. 4 is a schematic cross-sectional view illustrating a third specific example of the gate structure of the semiconductor device illustrated in FIG. 1.

FIG. 4 is a schematic cross-sectional view illustrating a third specific example of the gate structure of the semiconductor device illustrated in FIG. 1.

As illustrated in FIG. 4, the HfSiCN film may be formed into the gate configuration using a resist mask formed on the HfSiCN film without forming the polycrystalline silicon film on the HfSiCN film. In such a case, the film thickness of the HfSiCN film is formed thicker than that of the case in which the polycrystalline silicon film is provided thereon. Typically, 50 to 100 nm is favorable. However, in regard to ease of forming, it is favorable to form the HfSiCN film after forming the polycrystalline silicon film 8 thereon as illustrated in FIGS. 2 and 3.

Figure 5:
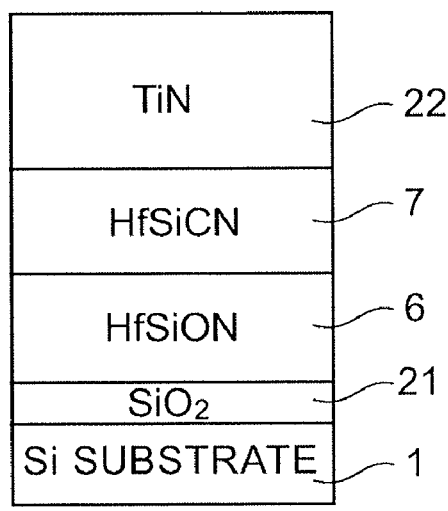
FIG. 5 is a schematic cross-sectional view illustrating a fourth specific example of the gate structure of the semiconductor device illustrated in FIG. 1.

FIG. 5 is a schematic cross-sectional view illustrating a fourth specific example of the gate structure of the semiconductor device illustrated in FIG. 1.

While the second specific example illustrated in FIG. 3 recited above is an example in which the polycrystalline silicon film 8 is formed on the TiN film 22, the TiN film 22 and the HfSiCN film may be formed into the gate configuration using a resist mask formed on the TiN film 22 without forming the polycrystalline silicon film 8 on the TiN film 22 as illustrated in FIG. 5. In the case of such a structure, it is favorable that the film thickness of the TiN film 22 is typically 50 to 100 nm.

It is unnecessary that the composition ratios of the elements in each film of the gate insulation film 6 (the HfSiON film) and the gate electrode 7 (the HfSiCN film) are uniform.

Figures 6A, 6B:
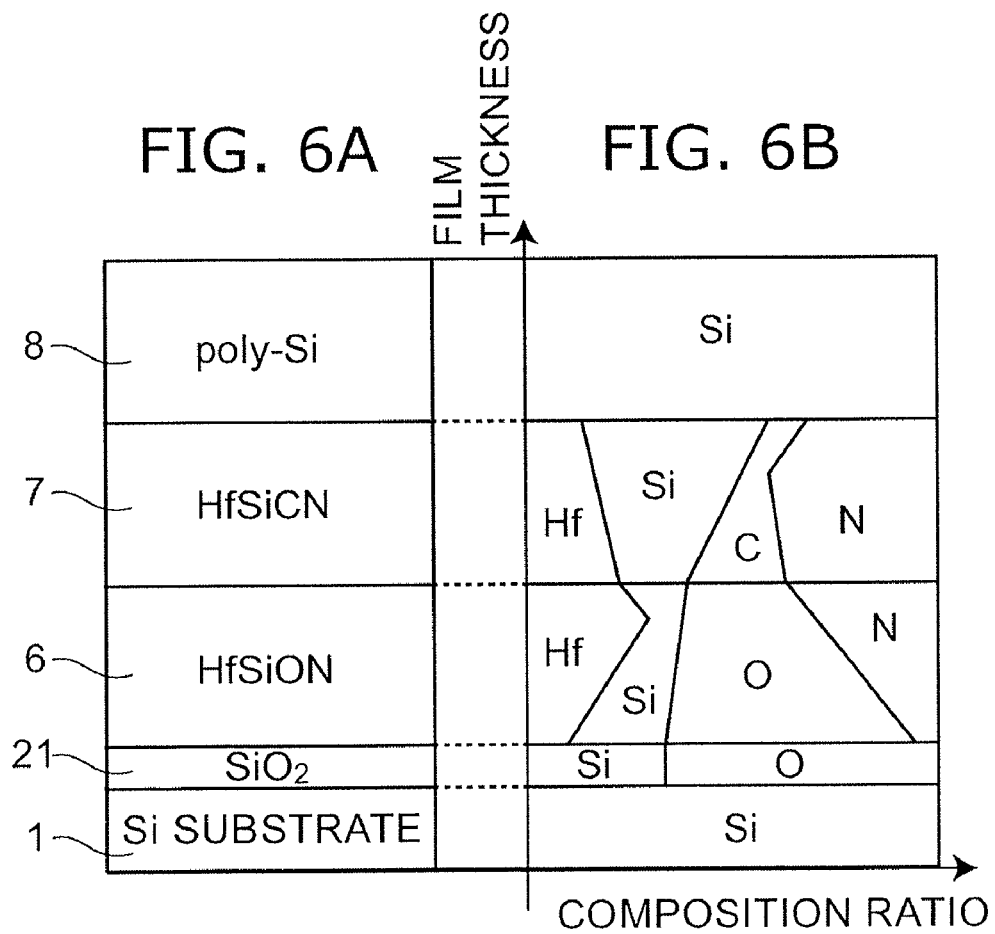
FIGS. 6A and 6B are schematic cross-sectional views illustrating composition ratios for each layer of the structure illustrated in FIG. 2.

For example, FIGS. 6A and 6B illustrate an example of composition ratios (FIG. 6B) for each film of the structure of FIG. 2 (FIG. 6A).

In the HfSiON film formed as the gate insulation film 6, the concentrations of Hf and N proximal to the substrate 1 are low to improve the mobility. To reduce gate leakage, the concentrations of Hf and N are higher toward the interior (the gate electrode 7 side) than toward the side proximal to the substrate 1. It is unnecessary that the peak of the composition ratio is located at the center of the film in the film thickness direction. The peak may be toward the gate electrode 7 such as that of Hf, or may have a maximum at the interface with the gate electrode 7 such as that of N.

In the HfSiCN film formed as the gate electrode 7, the composition may tend to have a Si concentration that increases and a Hf concentration that decreases as the interface with the polycrystalline silicon film 8 is approached to inhibit reactions with the polycrystalline silicon film 8. Even in the case where the concentrations of C and N decrease proximal to the interface with the polycrystalline silicon film 8 due to a high-temperature annealing after the HfSiCN deposition, the effects of the present invention such as those described above can be obtained.

It is more favorable that the concentration of Hf is about the same in the HfSiCN film and the HfSiON film proximal to the interface between the HfSiCN film and the HfSiON film, and likewise for Si, to inhibit mutual diffusion of Hf and Si between the HfSiCN film and the HfSiON film. The composition ratio illustrated in FIGS. 6A and 6B is one example, and the present invention is not limited to such a composition ratio.

The HfSiON film may be formed by simultaneously supplying TEOS ($Si(OC_2H_5)_4$), HTB ($Hf(OC(CH_3)_3)_4$), and $O_2$ as the precursors during deposition by CVD. Other possible precursors include alkoxide-type materials, $HfCl_4$, and the like. However, in regard to reducing costs during mass production, it is favorable that the HfSiON film and the HfSiCN film are formed using the same precursor. TDEAH and TDMAS illustrated in the specific examples described above are examples thereof.

The HfSiON film may be formed also by ALD (Atomic Layer Deposition) using TDEAH, TDMAS, and $H_2O$. The substrate temperature at this time typically is not more than 300° C. Thermal CVD is more favorable in regard to production costs.

The HfSiCN film may be formed also by ALD using TDEAH, TDMAS, and $NH_3$. Thermal CVD is more favorable in regard to production costs.

Polycrystalline SiGe, amorphous Si, and amorphous SiGe also may be used instead of the polycrystalline silicon film 8. The atmosphere for the deposition thereof also may include $SiH_2Cl_2$ or sufficiently diluted $N_2O$.

Even in the case where the gate electrode 7 (the HfSiCN film) or the film between the silicon substrate 1 and the gate electrode 7 (the HfSiON film) includes La (lanthanum), Al (aluminum), and the like, the effects of the present invention described above can be expected, and the threshold can be changed.

The threshold (absolute value thereof) can be reduced by including La in the films recited above in the case of an n-type MISFET. The threshold (absolute value thereof) can be reduced by including Al in the films recited above in the case of a p-type MISFET.

The Hf included in the gate insulation film 6 and the gate electrode 7 may be replaced with Zr (zirconium) which has similar characteristics thereto, or both Hf and Zr may be included. A gate electrode 7 containing Zr has slightly improved thermal stability without greatly changing the work function.

For example, even in the case where the gate insulation film 6 includes Zr but not Hf and the gate electrode 7 includes Hf but not Zr, Hf and Zr have similar characteristics. Therefore, diffusion of Zr from the gate insulation film 6 into the gate electrode 7 and diffusion of Hf from the gate electrode 7 into the gate insulation film 6 can be reduced. Similarly, even in the case where the gate insulation film 6 includes Hf but not Zr and the gate electrode 7 includes Zr but not Hf, diffusion of Hf from the gate insulation film 6 into the gate electrode 7 and diffusion of Zr from the gate electrode 7 into the gate insulation film 6 can be reduced.

An HfZrSiO film can be formed similarly to the HfSiO film described above by using the precursors of TDEAZ ($Zr[N(C_2H_5)_2]_4$), TDEAH ($Hf[N(C_2H_5)_2]_4$), and TDMAS ($Si[N(CH_3)_2]_4$). Then, an HrZrSiON film can be formed by performing plasma nitriding similarly to the first specific example.

An HfZrSiCN film can be formed similarly to the HfSiCN film described above by using the precursors of TDEAZ ($Zr[N(C_2H_5)_2]_4$), TDEAH ($Hf[N(C_2H_5)_2]_4$), and TDMAS ($Si[N(CH_3)_2]_4$).

An HfZrSiGeCN film can be formed similarly to the HfSiCN film described above by using the precursors of TDEAZ ($Zr[N(C_2H_5)_2]_4$), TDEAH ($Hf[N(C_2H_5)_2]_4$), TDMAS ($Si[N(CH_3)_2]_4$), and $GeH_4$. Adding Ge to the gate electrode 7 can increase the work function and reduce the threshold of a p-type MISFET.

An HfZrSiGeCN film of about 2.0 nm can be formed by forming an HfZrSiCN film of 0.4 nm; forming a Ge layer of 0.1 nm in a $GeH_4$ atmosphere; repeating for a total of four times; and then annealing similarly to the method of the first specific example to mix the HfZrSiCN and the Ge. Here, the annealing temperature is about 900° C.

Specific examples of combinations for the gate electrode 7/gate insulation film 6 include HfCN/HfSiON, ZrCN/HfSiON, HfZrCN/HfSiON, HfSiCN/HfSiON, ZrSiCN/HfSiON, HfZrSiCN/HfSiON, HfGeCN/HfSiON, ZrGeCN/HfSiON, HfZrGeCN/HfSiON, HfSiGeCN/HfSiON, ZrSiGeCN/HfSiON, HfZrSiGeCN/HfSiON, HfCN/ZrSiON, ZrCN/ZrSiON, HfZrCN/ZrSiON, HfSiCN/ZrSiON, ZrSiCN/ZrSiON, HfZrSiCN/ZrSiON, HfGeCN/ZrSiON, ZrGeCN/ZrSiON, HfZrGeCN/ZrSiON, HfSiGeCN/ZrSiON, ZrSiGeCN/ZrSiON, HfZrSiGeCN/ZrSiON, HfCN/HfZrSiON, ZrCN/HfZrSiON, HfZrCN/HfZrSiON, HfSiCN/HfZrSiON, ZrSiCN/HfZrSiON, HfZrSiCN/HfZrSiON, HfGeCN/HfZrSiON, ZrGeCN/HfZrSiON, HfZrGeCN/HfZrSiON, HfSiGeCN/HfZrSiON, ZrSiGeCN/HfZrSiON, and HfZrSiGeCN/HfZrSiON.

The invention claimed is:

1. A method for manufacturing a semiconductor device, comprising:

forming a gate insulation film, including at least one of Hf and Zr, on a semiconductor layer; and forming a gate electrode, including least one of Hf and Zr, on the gate insulation film, wherein both the gate insulation film including at least one of Hf and Zr, and the gate electrode including at least one of Hf and Zr are formed using the same Hf precursor or Zr precursor, and a concentration of the one of Hf and Zr included in the gate insulation film and a concentration of the one of Hf and Zr included in the gate electrode are about same at an interface between the gate insulating film and the gate electrode.

2. The method according to claim 1, wherein a precursor including $Hf(NR^1R^2)_4$ is used as a precursor of Hf and a precursor including $SiR^3R^4R^5R^6$ is used as a precursor of Si to form the gate electrode as a film including Hf, Si, C, and N, where $R^1$ and $R^2$ are selected from H, $CH_3$, $C_2H_5$, and $C_3H_7$, and $R^3$, $R^4$, $R^5$, and $R^6$ are selected from H, $NH_2$, $N(CH_3)_2$, $N(C_2H_5)_2$, and $N(C_3H_7)_2$.

3. The method according to claim 1, wherein both the gate electrode including Hf, Si, C, and N and the gate insulation film including Hf, Si, O, and N are formed as films using the same Hf precursor and the same Si precursor.

4. The method according to claim 1, wherein the forming the gate insulation film includes:
  forming an HfSiO film by CVD (chemical vapor deposition); and
  forming an HfSiON film by performing plasma nitriding on the HfSiO film.

5. The method according to claim 1, wherein the forming the gate electrode includes forming an HfSiCN film by CVD (chemical vapor deposition).

6. The method according to claim 5, wherein hydrogen gas is added to a source gas when forming the HfSiCN film by the CVD.

7. The method according to claim 5, wherein the forming the gate electrode further includes performing plasma nitriding on the HfSiCN film.

8. The method according to claim 1, wherein both the gate insulation film including Si and the gate electrode including Si are formed using the same Si precursor.

9. The method according to claim 1, wherein the gate electrode includes a carbonitride.

10. The method according to claim 1, wherein the Hf precursor or the Zr precursor includes a carbon.

* * * * *